United States Patent
Lee et al.

(10) Patent No.: US 11,869,964 B2
(45) Date of Patent: Jan. 9, 2024

(54) FIELD EFFECT TRANSISTORS WITH MODIFIED ACCESS REGIONS

(71) Applicant: Wolfspeed, Inc., Durham, NC (US)

(72) Inventors: Kyoung-Keun Lee, Cary, NC (US); Fabian Radulescu, Chapel Hill, NC (US); Scott Sheppard, Chapel Hill, NC (US)

(73) Assignee: Wolfspeed, Inc., Durham, NC (US)

( * ) Notice: Subject to any disclaimer, the term of this patent is extended or adjusted under 35 U.S.C. 154(b) by 260 days.

(21) Appl. No.: 17/325,635

(22) Filed: May 20, 2021

(65) Prior Publication Data

US 2022/0376106 A1 Nov. 24, 2022

(51) Int. Cl.
*H01L 29/66* (2006.01)
*H01L 29/778* (2006.01)
*H01L 29/20* (2006.01)
*H01L 29/08* (2006.01)

(52) U.S. Cl.
CPC ...... *H01L 29/7787* (2013.01); *H01L 29/0891* (2013.01); *H01L 29/2003* (2013.01); *H01L 29/66462* (2013.01)

(58) Field of Classification Search
CPC ............. H01L 29/0891; H01L 29/2003; H01L 29/66462
See application file for complete search history.

(56) References Cited

U.S. PATENT DOCUMENTS

| | | | |
|---|---|---|---|
| 6,849,882 B2 | 2/2005 | Chavarkar et al. | |
| 7,126,426 B2 | 10/2006 | Mishra et al. | |
| 7,230,284 B2 | 6/2007 | Parikh et al. | |
| 7,501,669 B2 | 3/2009 | Parikh et al. | |
| 7,550,783 B2 | 6/2009 | Wu et al. | |
| 7,573,078 B2 | 8/2009 | Wu et al. | |
| 7,709,859 B2 | 5/2010 | Smith et al. | |
| 7,906,799 B2 | 3/2011 | Sheppard et al. | |
| 9,666,707 B2 | 5/2017 | Sheppard et al. | |
| 9,847,411 B2 | 12/2017 | Sriram et al. | |
| 9,984,881 B2 | 5/2018 | Sheppard et al. | |
| 10,388,753 B1* | 8/2019 | Armstrong | H01L 21/02642 |
| 10,971,612 B2 | 4/2021 | Bothe et al. | |
| 2005/0253167 A1 | 11/2005 | Wu et al. | |
| 2006/0202272 A1 | 9/2006 | Wu et al. | |
| 2006/0255366 A1* | 11/2006 | Sheppard | H01L 29/66462 |
| | | | 257/E21.407 |
| 2007/0164315 A1* | 7/2007 | Smith | H01L 29/7786 |
| | | | 257/E29.253 |
| 2008/0128752 A1 | 6/2008 | Wu | |
| 2008/0203430 A1* | 8/2008 | Simin | H01L 29/7783 |
| | | | 257/192 |

(Continued)

*Primary Examiner* — Jay C Chang
*Assistant Examiner* — Siangluai Mang
(74) *Attorney, Agent, or Firm* — Sage Patent Group

(57) ABSTRACT

A transistor device includes a semiconductor epitaxial layer structure including a channel layer and a barrier layer on the channel layer, wherein the barrier layer has a higher bandgap than the channel layer. A modified access region is provided at an upper surface of the barrier layer opposite the channel layer. The modified access region includes a material having a lower surface barrier height than the barrier layer. A source contact and a drain contact are formed on the barrier layer, and a gate contact is formed between source contact and the drain contact.

28 Claims, 17 Drawing Sheets

(56) References Cited

U.S. PATENT DOCUMENTS

| | | | |
|---|---|---|---|
| 2009/0146185 A1* | 6/2009 | Suh | H01L 29/42364 |
| | | | 257/E27.061 |
| 2010/0276698 A1 | 11/2010 | Moore et al. | |
| 2012/0049973 A1 | 3/2012 | Smith, Jr. et al. | |
| 2012/0194276 A1 | 8/2012 | Fisher | |
| 2015/0021552 A1* | 1/2015 | Mishra | H01L 29/205 |
| | | | 257/20 |
| 2017/0338810 A1* | 11/2017 | Chen | H01L 29/205 |
| 2022/0130965 A1 | 4/2022 | Bothe et al. | |
| 2022/0130985 A1 | 4/2022 | Bothe et al. | |
| 2022/0271153 A1* | 8/2022 | Chiang | H01L 21/31116 |
| 2022/0376085 A1 | 11/2022 | Bothe et al. | |
| 2022/0376098 A1 | 11/2022 | Lee et al. | |
| 2022/0376099 A1 | 11/2022 | Bothe et al. | |
| 2022/0376104 A1 | 11/2022 | Bisges et al. | |
| 2022/0376105 A1 | 11/2022 | Guo et al. | |

\* cited by examiner

FIELD EFFECT TRANSISTORS WITH MODIFIED ACCESS REGIONS

BACKGROUND

The present disclosure relates to transistor structures and in particular to high electron mobility transistors.

Narrow bandgap semiconductor materials, such as silicon (Si) and gallium arsenide (GaAs), are widely used in semiconductor devices for low power and, in the case of Si, low frequency applications. However, these semiconductor materials may not be well-suited for high power and/or high frequency applications, for example, due to their relatively small bandgaps (1.12 eV for Si and 1.42 for GaAs at room temperature) and relatively small breakdown voltages.

Interest in high power, high temperature and/or high frequency applications and devices has focused on wide bandgap semiconductor materials such as silicon carbide (3.2 eV for 4H—SiC at room temperature) and the Group III nitrides (e.g., 3.36 eV for GaN at room temperature). These materials may have higher electric field breakdown strengths and higher electron saturation velocities than GaAs and Si.

A device of particular interest for high power and/or high frequency applications is the High Electron Mobility Transistor (HEMT), which is also known as a modulation doped field effect transistor (MODFET). In a HEMT device, a two-dimensional electron gas (2DEG) may be formed at the heterojunction of two semiconductor materials with different bandgap energies, where the smaller bandgap material has a higher electron affinity than the wider bandgap material. The 2DEG is an accumulation layer in the undoped smaller bandgap material and can contain a relatively high sheet electron concentration, for example, in excess of $10^{13}$ carriers/cm$^2$. Additionally, electrons that originate in the wider bandgap semiconductor may transfer to the 2DEG, allowing a relatively high electron mobility due to reduced ionized impurity scattering. This combination of relatively high carrier concentration and carrier mobility can give the HEMT a relatively large transconductance and may provide a performance advantage over metal-semiconductor field effect transistors (MESFETS) for high-frequency applications.

HEMTs fabricated in the gallium nitride/aluminum gallium nitride (GaN/AlGaN) material system can generate large amounts of RF power due to a combination of material characteristics, such as relatively high breakdown fields, relatively wide bandgaps, relatively large conduction band offset, and/or relatively high saturated electron drift velocity. A major portion of the electrons in the 2DEG may be attributed to polarization in the AlGaN.

FIG. 1 illustrates a conventional gallium nitride-based HEMT structure. The structure includes a substrate 10, which may be a semi-insulating 4H silicon carbide (SiC) substrate. Optional buffer, nucleation and/or transition layers (not shown) may be provided on the substrate 10. A channel layer 20 is provided on the substrate 10. The channel layer 20 may be a Group III-nitride, such as GaN. A barrier layer 22 is provided on the channel layer 20. The barrier layer 22 has a bandgap that is greater than the bandgap of the channel layer 20 and the channel layer 20 may have a larger electron affinity than the barrier layer 22. The barrier layer 22 may be AlN, AlInN, AlGaN or AlInGaN, and is thick enough and has a high enough Al composition and doping to induce a significant carrier concentration at the interface between the channel layer 20 and the barrier layer 22. This induced carrier concentration forms a two dimensional electron gas (2DEG) which provides a conductive channel in the device. The conductivity of the 2DEG channel can be modulated by applying a voltage to a gate contact 32 formed on the barrier layer 22.

FIG. 1A also illustrates a cap layer 24 on the barrier layer 22 with the gate contact 32 in a recess 36 through the cap layer 24. The cap layer 24 moves the top (outer) surface of the device physically away from the channel, which may reduce surface effects of the device. The cap layer 24 may be blanket formed on the barrier layer 22 and may be epitaxially grown and/or formed by deposition. Typically, the cap layer 24 may have a thickness of from about 2 nm to about 500 nm.

As is further illustrated in FIG. 1A, ohmic source/drain contacts 30 are provided on the barrier layer 22, and a gate recess is provided through the cap layer 24 to expose a portion of the barrier layer 22. A gate contact 32 is formed in the recess and contacts the exposed portion of the barrier layer 22. The gate contact 32 may be a "T" gate as illustrated in FIG. 1A.

A passivation layer (not shown) may also be provided on the structure of FIG. 1A. For example, referring to FIG. 1B, a SiN layer 52 may be formed in situ over the surface of the device. The structure of FIG. 1B including the passivation layer may be annealed in a nitrogen environment to enhance process parameters.

Even with the presence of a cap layer 24 and annealing the structure, conventional HEMT structures may suffer from trapped charges in the barrier layer or channel layer of the device, which can cause distortion of signals passing through the device. For example, trapped charges can cause an output lag, which can undesirably reduce the switching speed, and therefore the bandwidth, of the device.

SUMMARY

A transistor device according to some embodiments includes a semiconductor epitaxial layer structure including a channel layer and a barrier layer on the channel layer, wherein the barrier layer has a higher bandgap than the channel layer, and a modified access region at an upper surface of the barrier layer opposite the channel layer. The modified access region includes a material having a lower surface barrier height than the barrier layer. A source contact and a drain contact are formed on the barrier layer, and a gate contact is formed between source contact and the drain contact.

In some embodiments, the gate contact may form a Schottky contact to the modified access region. In other embodiments, the gate contact may not contact the modified access region.

The transistor device may further include a doped source region in the barrier layer, wherein the source contact contacts the source region, and a doped drain region in the barrier layer, wherein the drain contact contacts the drain region. The source region and drain region define an active region of the device between the source region and the drain region, and the modified access region is on the barrier layer over the entire active region of the device.

In some embodiments, the modified access region includes a region of increased conductivity at an upper surface of the barrier layer opposite the channel layer.

In some embodiments, the modified access region includes an implanted region including implanted dopants at the upper surface of the barrier layer opposite the channel layer.

In some embodiments, the modified access region has a thickness of about 0.1 nm to about 40 nm and a doping concentration of about 1E14 cm$^{-3}$ to about 1E17 cm$^{-3}$. In some embodiments, the modified access region has a thickness of about 0.5 nm to about 10 nm.

In some embodiments, the modified access region includes an epitaxial semiconductor layer of a material having a lower bandgap than the barrier layer. In some embodiments, the barrier layer includes AlGaN and the modified access region includes AlGaN with a lower concentration of Al than the barrier layer. In some embodiments, the barrier layer includes AlGaN and the modified access region includes GaN. The modified access region may be doped with n-type dopants.

The modified access region may provide a charge emission path that allows charge carriers present at an upper surface of the barrier layer opposite the channel layer to conduct toward the drain contact.

In some embodiments, the modified access region is not provided in a region between the source contact and the gate contact. In some embodiments, the modified access region is in a region between the gate contact and the drain contact and does not extend completely from the source contact to the drain contact. The gate contact may not contact the modified access region.

The transistor device may further include a doped drain region in the barrier layer wherein the drain contact contacts the drain region, wherein the modified access region contacts the drain region.

A method of forming a transistor device according to some embodiments includes providing a semiconductor epitaxial layer structure including a channel layer and a barrier layer on the channel layer, wherein the barrier layer has a higher bandgap than the channel layer, forming a modified access region at an upper surface of the barrier layer opposite the channel layer, forming a source contact and a drain contact on the barrier layer, and forming a gate contact between source contact and the drain contact. The modified access region includes a material having a lower surface barrier height than the barrier layer.

In some embodiments, forming the modified access region includes forming a sacrificial dielectric layer on the barrier layer, annealing the sacrificial dielectric layer and the barrier layer, and removing the sacrificial dielectric layer. The sacrificial dielectric layer may include SiN, SiOx, AlN, AlO, and/or HfO.

In some embodiments, forming the modified access region includes forming an epitaxial layer on the barrier layer of a material having a lower bandgap than the barrier layer. The epitaxial layer may be doped with n-type dopants.

In some embodiments, forming the modified access region includes implanting n-type dopants into an upper surface of the barrier layer opposite the channel layer.

In some embodiments, the modified access region is in a region between the gate contact and the drain contact and does not extend completely between the source contact and the drain contact.

The gate contact may not contact the modified access region.

The method may further include forming a doped drain region in the barrier layer wherein the drain contact contacts the drain region, wherein the modified access region contacts the drain region.

DETAILED DESCRIPTION OF EMBODIMENTS

Figure 1A:
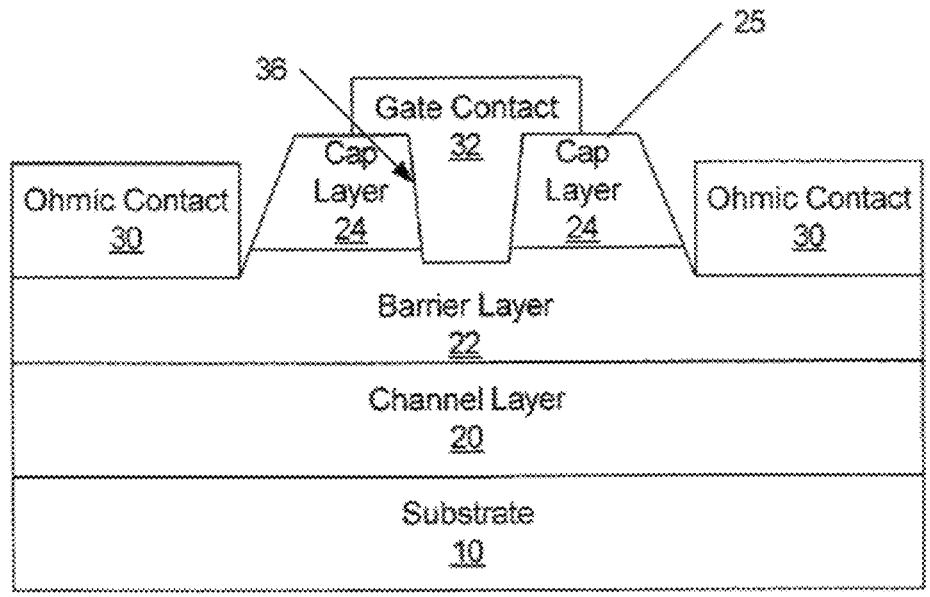
FIG. 1A is a cross-sectional view of a conventional transistor device.
Figure 1B:
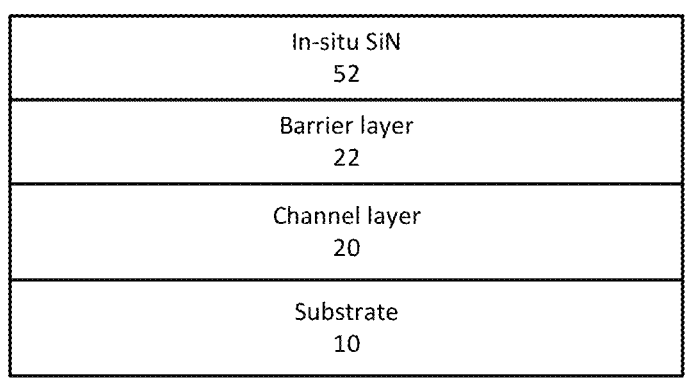
FIG. 1B is a cross-sectional view of an intermediate structure of a conventional transistor device.

Embodiments of the inventive concepts will now be described in connection with the accompanying drawings. Some embodiments described herein provide a transistor device including a field plate that is self-aligned the gate, and in some embodiments that is laterally spaced apart from the gate, such that the field plate does not overlap the gate in the vertical direction. In some embodiments, the field plate is recessed toward the barrier layer in a recess region. In still further embodiments, the field plate may be connected to the source outside an active area of the device by means of a connection that does not cross over the gate of the device.

It is also understood that, although the ordinal terms first, second, third, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Furthermore, relative terms, such as "lower" or "bottom" and "upper" or "top," may be used herein to describe the relationship of one element to another as illustrated in the drawings. It is understood that relative terms are intended to encompass different orientations of the device in addition to the orientation depicted in the drawings. For example, if the device in one of the drawings is turned over, features described as being on the "lower" side of an element would then be oriented on "upper" side of that element. The exemplary term "lower" can therefore describe both lower and upper orientations, depending of the particular orientation of the device. Similarly, if the device in one of the drawings is turned over, elements described as "below" or "beneath" other elements would then be oriented above those other elements. The exemplary terms "below" or "beneath" can therefore describe both an orientation of above and below.

The terminology used in the description of the disclosure herein is for the purpose of describing particular embodiments only and is not intended to be limiting of the disclosure. As used in the description of the disclosure and the appended claims, the singular forms "an" and "the" are intended to include the plural forms as well, unless the context clearly indicates otherwise. It is also understood that the term "and/or" as used herein refers to and encompasses any and all possible combinations of one or more of the associated listed items. It will be further understood that the terms "comprises" and "comprising," when used in this specification, specify the presence of stated steps, operations, features, elements, and/or components, but do not preclude the presence or addition of one or more other steps, operations, features, elements, components, and/or groups thereof.

Embodiments of the disclosure are described herein with reference to cross-section illustrations that are schematic illustrations of idealized embodiments of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. The regions illustrated in the drawings are schematic in nature, and their shapes are not intended to illustrate the actual shape of a region of a device and are not intended to limit the scope of the disclosure unless explicitly stated otherwise. Further, lines that appear straight, horizontal, or vertical in the below drawings for schematic reasons will often be sloped, curved, non-horizontal, or non-vertical. Further, while the thicknesses of elements are meant to be schematic in nature.

Unless otherwise defined, all terms used in disclosing embodiments of the disclosure, including technical and scientific terms, have the same meaning as commonly understood by one of ordinary skill in the pertinent art and are not necessarily limited to the specific definitions known at the time of the present disclosure. Accordingly, these terms can include equivalent terms that are created after such time. It is further understood that terms, such as those defined in commonly used dictionaries, should be interpreted as having a meaning that is consistent with their meaning in the present specification and in the context of the relevant art.

Trapped charges in semiconductor devices, such as GaN HEMT devices, can cause non-linear distortion in output signals generated by the devices. To reduce such distortion, it is desirable to reduce the presence of trapped charges in the barrier layer of a HEMT device. Although not wishing to be bound by a particular theory, it is presently believed that charges may be injected into the barrier and/or channel layer of a HEMT device from the gate contact of the device, and that such charges may become trapped in the barrier and/or channel layer, where they may adversely affect the switching characteristics of the device. Some embodiments provide a modified access region having a low surface barrier height (SBH) at or on the upper surface of the barrier layer that forms a charge emission path that allows some charges that would otherwise become injected into the barrier and/or channel layer to instead conduct along an upper surface of the barrier layer to the drain contact of the device. The modified access region comprises a material having a lower surface barrier height than the barrier layer of the HEMT relative to the gate contact. By reducing the number of charges that may become trapped in the barrier layer, switching characteristics of the device may be improved.

Figure 2:
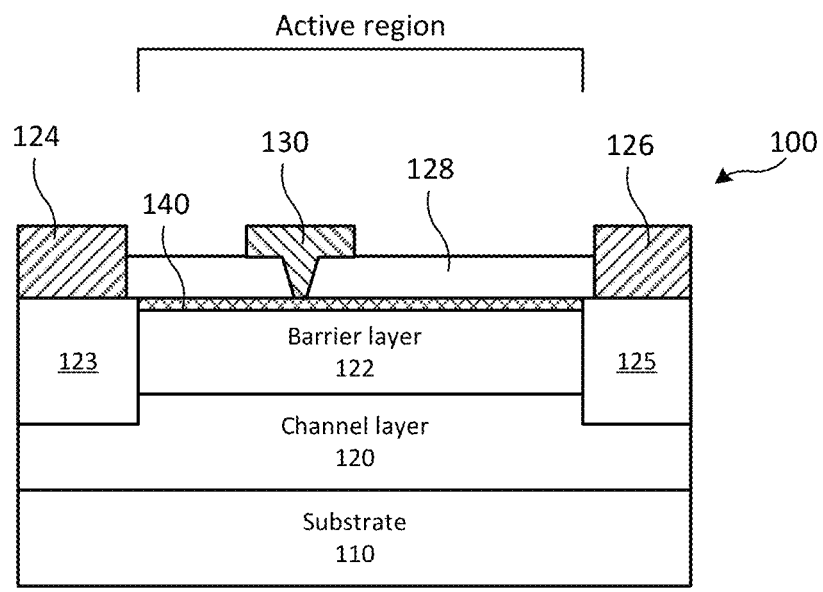
FIG. 2 is a schematic plan view of a HEMT device according to some embodiments.

A GaN HEMT structure 100 according to some embodiments is illustrated in FIG. 2. As shown therein, the structure includes a substrate 110 on which a channel layer 120 is formed. A barrier layer 122 is formed on the channel layer. Doped source and drain regions 123, 125 are formed in the barrier layer 122 and may extend into the channel layer 120, and source and drain ohmic contacts 124, 126 are formed on the source and drain regions 123, 125, respectively.

As further illustrated in FIG. 2, a modified access region 140 having a low surface barrier height (SBH) is formed on an upper surface of the barrier layer 122 opposite the channel layer 120 within an active region of the device between the source region 123 and the drain region 125. A gate contact 130 is formed on the modified access region 140.

Although not wishing to be bound by a particular theory, it is believed that the presence of the modified access region 140 provides a charge emission path that allows charges present at the surface of the barrier layer 122, such as charges that may have been injected from the gate contact 130, to flow to the drain region 125 instead of becoming trapped in the barrier layer 122 and/or channel layer 120 where they can affect the charge transfer characteristics of the device.

A passivation film 128, such as a dielectric film is formed on the structure, and a gate contact 130 is formed on the passivation film 128. The gate contact 130 extends through an opening in the passivation film 128 to contact the modified access region 140.

The substrate 110 may be a semi-insulating silicon carbide (SiC) substrate that may be, for example, 4H polytype of silicon carbide. Other silicon carbide candidate polytypes include the 3C, 6H, and 15R polytypes. In particular embodiments of the inventive concepts, the silicon carbide bulk crystal has a resistivity equal to or higher than about $1 \times 10^5$ Ω-cm at room temperature. Optional buffer, nucleation and/or transition layers (not shown) may be provided on the substrate 110. For example, an AlN buffer layer may be provided to provide an appropriate crystal structure transition between the silicon carbide substrate and the remainder of the device.

Although silicon carbide may be used as a substrate material, some embodiments may utilize any suitable substrate, such as sapphire, aluminum nitride, aluminum gallium nitride, gallium nitride, silicon, GaAs, LGO, ZnO, LAO, InP and the like.

Still referring to FIG. 2, the channel layer 120 may be deposited on the substrate 110 using buffer layers, transition layers, and/or nucleation layers as described above. Furthermore, the channel layer and/or buffer nucleation and/or transition layers may be deposited by MOCVD or by other techniques known to those of skill in the art, such as MBE or HVPE.

In some embodiments, the channel layer 120 is a Group III-nitride, such as AlxGa1-xN where 0≤x<1, provided that the energy of the conduction band edge of the channel layer 120 is less than the energy of the conduction band edge of the barrier layer 122 at the interface between the channel and barrier layers. In some embodiments, x=0, indicating that the channel layer 120 is GaN. The channel layer 120 may also be other Group III-nitrides such as InGaN, AlInGaN or the like. The channel layer 120 may be undoped ("unintentionally doped") and may be grown to a thickness of greater than about 20 Å. The channel layer 120 may also be a multi-layer structure, such as a superlattice or combinations of GaN, AlGaN or the like.

The channel layer 120 may have a bandgap that is less than the bandgap of the barrier layer 122 and the channel layer 120 may also have a larger electron affinity than the barrier layer 122. In some embodiments, the barrier layer 122 is AlN, AlInN, AlGaN or AlInGaN with a thickness of between about 0.1 nm and about 40 nm. In particular embodiments, the barrier layer 122 is thick enough and has a high enough Al composition and doping to induce a significant carrier concentration at the interface between the channel layer 120 and the barrier layer 122.

In some embodiments, the barrier layer 122 is AlGaN, AlInGaN and/or AlN or combinations of layers thereof. The barrier layer 122 may, for example, be from about 0.1 nm to about 40 nm thick, but is not so thick as to cause cracking or substantial defect formation therein. In some embodiments, the barrier layer 122 is undoped or doped with an n-type dopant to a concentration less than about $10^{19}$ cm$^{-3}$. In some embodiments of the inventive concepts, the barrier layer 122 is AlxGa1-xN where 0<x≤1. In particular embodiments, the aluminum concentration is about 25%. However, in other embodiments of the inventive concepts, the barrier layer 122 comprises AlGaN with an aluminum concentration of between about 5% and about 100%. In specific embodiments of the inventive concepts, the aluminum concentration is greater than about 10%.

The gate contact 130 may be a "T" gate as illustrated in FIG. 2 and may be fabricated using conventional fabrication techniques. The gate contact 130 may be fabricated using conventional fabrication techniques. Suitable gate materials may depend on the composition of the barrier layer. In some embodiments, conventional materials capable of making a Schottky contact to a nitride based semiconductor material may be used, such as Ni, Pt, NiSix, Cu, Pd, Cr, W and/or WSiN.

The passivation layer 128 may be a SiN layer. Optionally, the structure including the passivation layer may be annealed in a nitrogen environment at a temperature of 100° C. to 1200° C. to activate implanted dopants.

Figure 3A:
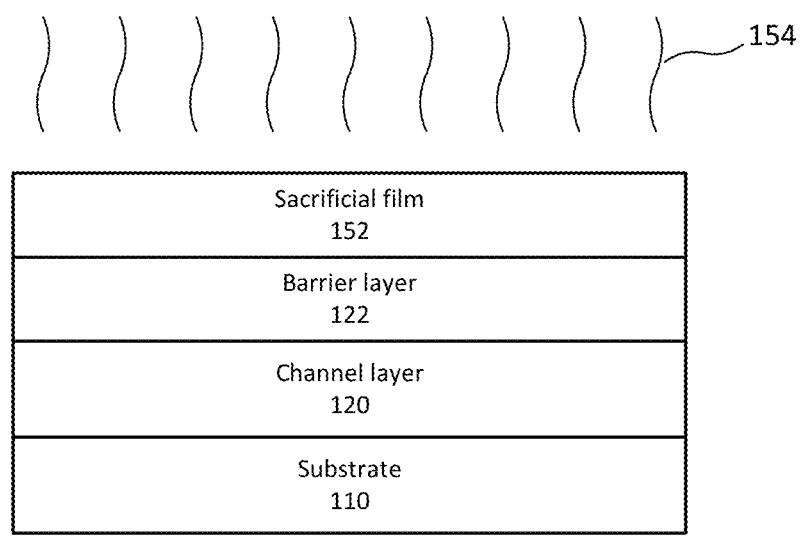
FIGS. 3A to 3D are cross-sectional views illustrating operations for forming HEMT device structures according to various embodiments.

The modified access region 140 may be formed in various ways. For example, some options for forming the modified access region 140 are illustrated in FIGS. 3A to 3D. Referring to FIG. 3A, in some embodiments, after formation of the barrier layer 122 on the channel layer 120, a sacrificial film 152 is formed on the barrier layer 122. The sacrificial film 152 may be a dielectric film having a different stoichiometry from the barrier layer 122. In particular embodiments, the sacrificial film 152 may include a dielectric material, such as SiN, SiOx, AlN, AlO, HfO, etc. The sacrificial film 152 may be doped or undoped, and may have a thickness of about 10 nm to about 200 nm.

With the sacrificial film 152 in place, the structure is annealed by exposing the structure to heat 154. The structure may be annealed at a temperature of about 100° C. to about 1200° C. for a time period of about 10 seconds to about 1 hour. The anneal may be carried out in an atmosphere such as nitrogen, argon or another inert gas.

During annealing, the modified access region 140 is formed at the surface of the barrier layer 122. The modified access region 140 may extend about 0.1 nm to about 40 nm into the barrier layer 122. In particular embodiments, the modified access region may extend about 0.5 nm to about 10 nm into the barrier layer 122.

The sacrificial film 152 is then stripped, for example using a HF etch or other stripping process, to clean the surface of the barrier layer 122, leaving the modified access region 140 in place. Remaining operations of device fabrication are then performed (e.g., formation of source/drain regions 123, 125, source/drain contacts 124, 126, passivation layer 128, gate 130 and other dielectric/metallization layers).

Figure 3B:
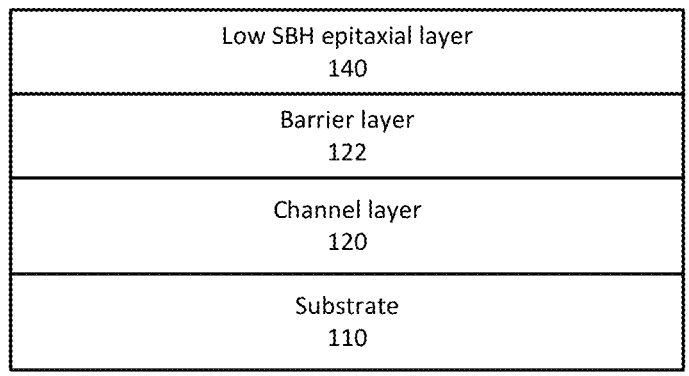
Figure 12:
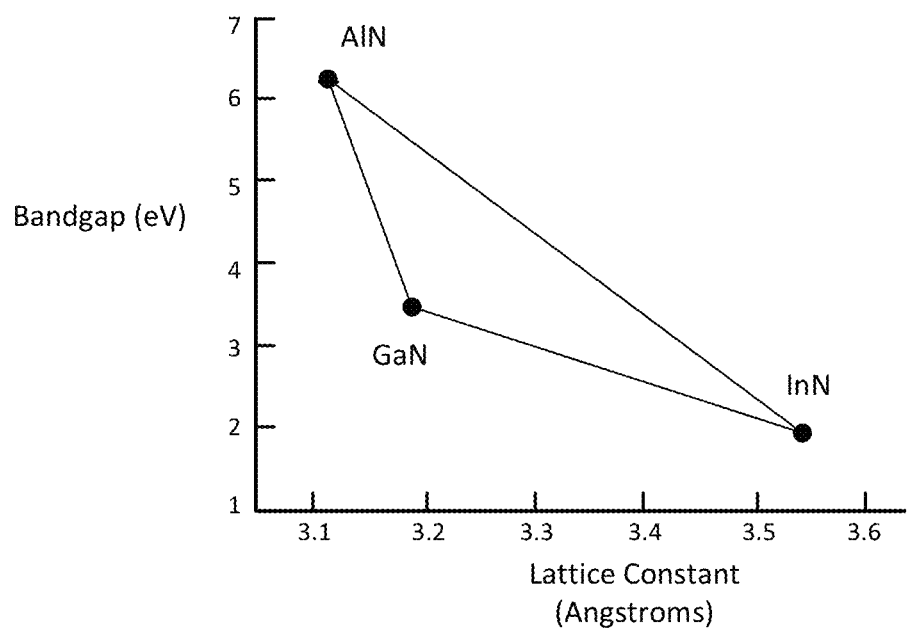
FIG. 12 is a schematic illustration of bandgap and lattice constant for InAlGaN material having various different compositions

Referring to FIG. 3B, the modified access region 140 may in some embodiments be formed as an epitaxial layer on the barrier layer 122. The modified access region 140 may be formed, for example, as a thin epitaxial layer of a Group III-nitride-based material having a lower bandgap than the barrier layer 122. In particular embodiments, the modified access region 140 may be formed as an epitaxial layer of InAlGaN having relative concentrations of In, Al and Ga that cause the modified access region 140 to have a lower bandgap than the barrier layer 122. The relationship between In, Al and Ga concentrations in an InAlGaN material and the bandgap of the material is illustrated, for example, in FIG. 12, which is a schematic illustration of bandgap and lattice constant for InAlGaN material having various different compositions (i.e., different relative levels of In, Al and Ga). As can be seen in FIG. 12, as the percentage of Al in the material increases, the bandgap of the material generally increases to a high of over 6 eV for AlN, while as the percentage of In in the material increases, the bandgap of the material decreases to a low of less than 2 eV for InN.

In some embodiments, the modified access region 140 may comprise GaN or InGaN. The modified access region 140 may have a thickness of about 0.1 nm to about 40 nm, and may be doped or undoped. In some embodiments, the modified access region 140 may have a thickness of about 0.5 nm to about 10 nm. In some embodiments, the modified access region 140 may comprise highly doped AlGaN (e.g., AlGaN doped with a doping concentration greater than about 1E14 cm$^{-3}$). In still further embodiments, the modified access region 140 may be doped with n-type dopants, such as silicon, at a doping concentration from about 1E14 cm$^{-3}$ to about 1E17 cm$^{-3}$, and may have the same or similar bandgap as the barrier layer 122.

Figure 3C:
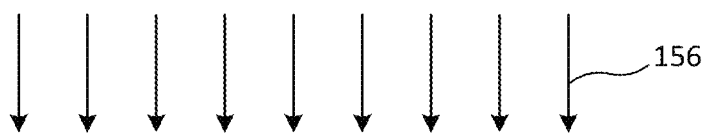
Figure 3C:
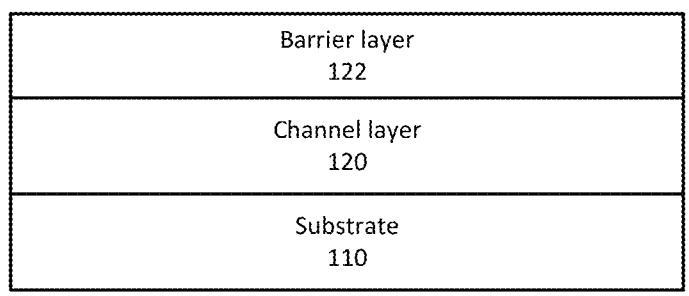

Referring to FIG. 3C, the modified access region 140 may be formed by implanting dopant ions 156 into the barrier layer 122. The modified access region 140 may be formed, for example, by implanting n-type dopants 156, such as silicon, into the surface of the barrier layer 122 to form a region of increased conductivity at the surface of the barrier layer 122. When formed as an implanted region in the barrier layer 122, the modified access region 140 may have a doping concentration of about 1E14 cm' to about 1E17 cm$^{-3}$ and may have a thickness of about 0.1 nm to about 40 nm. In some embodiments, the modified access region 140 may have a thickness of about 0.5 nm to about 10 nm.

A suitable modified access region 140 may be formed in the barrier layer 122 by implanting silicon ions into the barrier layer 122 at an implant energy of about 10 keV to about 100 keV and a suitable dose to form a layer with a doping concentration of about 1E14 cm$^{-3}$ to about 1E17 cm$^{-3}$.

The presence of the modified access region 140 may increase switching speed in a transistor according to some embodiments. For example, FIG. 4A illustrates results of a test setup including a conventional GaN HEMT transistor and a GaN HEMT transistor including a modified access region 140 as described herein, while FIG. 4B compares Schottky barrier heights of conventional transistors with Schottky barrier heights of transistors including modified access regions 140 as described herein.

Figure 4A:
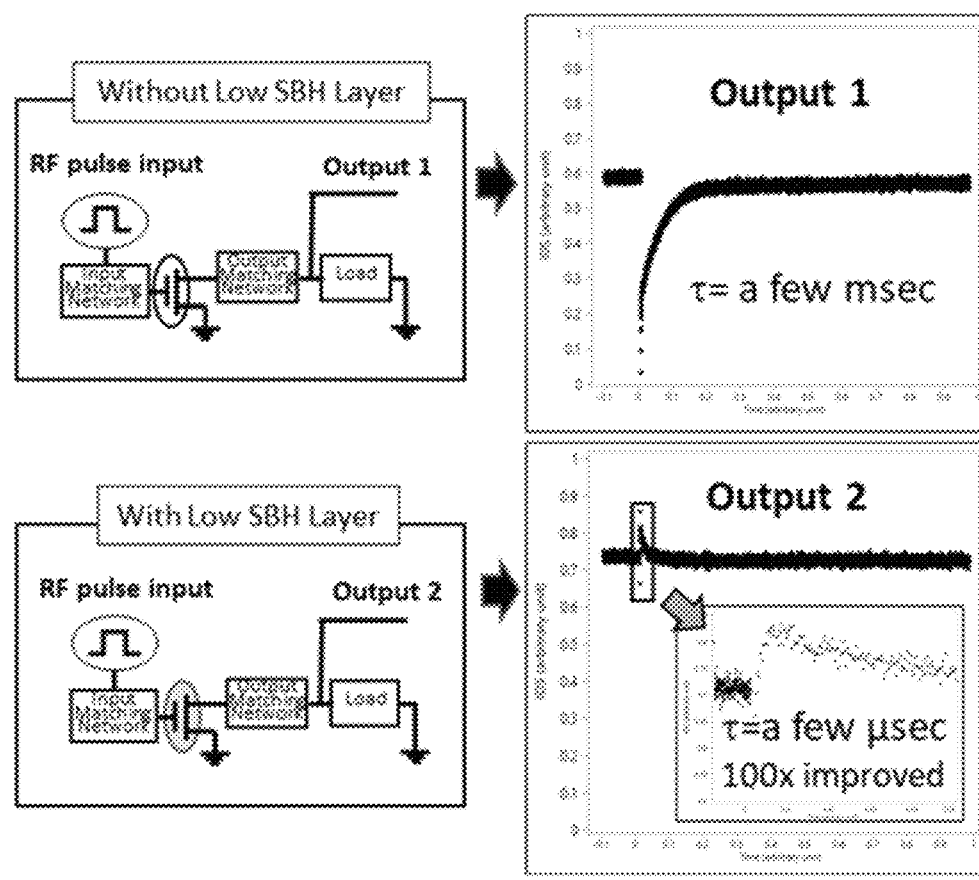
FIG. 4A illustrates results of a test setup including a conventional GaN HEMT and a GaN HEMT including a modified access region.

Referring to FIG. 4A, devices without (upper graph) and with (lower graph) the modified access region 140 were subjected to an RF pulse input. In particular the device transient behaviors were tested with a setup of input/output matching network circuits and a load under proper bias conditions and RF pulse input into the gate terminal of each device. The resulting output waveforms are shown on the right.

Devices without the modified access region 140 showed significant drain current drop (lag before recovery) at the beginning of applied RF pulse signal, which is believed to be influenced by the defect associated trapped charge. In particular, devices without the modified access region 140 exhibited a recovery time constant (t) of about a few milliseconds, while devices with the modified access region 140 exhibited a significantly shorter recovery time constant (t) of about a few microseconds. However, as can be seen in FIG. 4A, the devices with the modified access region 140 also exhibited some undesirable overshoot of the output signal.

Figure 4B:
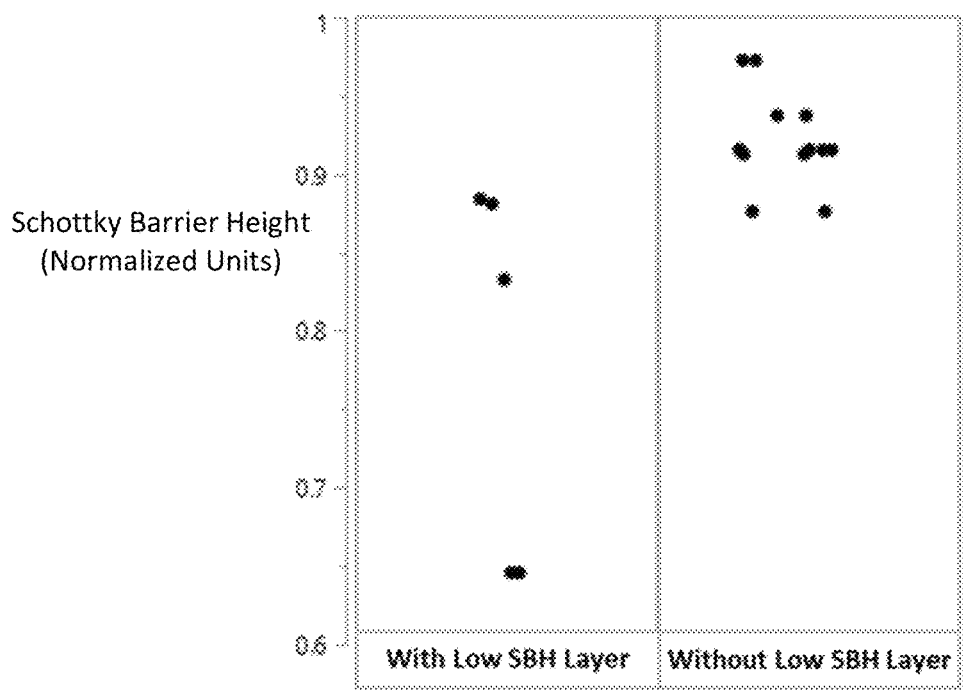
FIG. 4B is a chart that compares Schottky barrier heights of conventional transistors with Schottky barrier heights of transistors including modified access regions.

Referring to FIG. 4B, devices with the modified access region 140 had lower average Schottky barrier heights than devices without the modified access region 140, which may be undesirable. For example, the reduced Schottky barrier height may be responsible for the overshoot evident in FIG. 4A.

That is, FIG. 4B illustrates that having a modified access region with a low surface barrier height (SBH) across the entire surface of the device affects the Schottky barrier height of the gate electrode 130, which is energy barrier between semiconductor and metal. In other words, when the modified access region 140 covers the entire surface of the barrier layer 122, it is believed that the Schottky barrier height of the device may be undesirably reduced, since the modified access region 140 is touching the gate 130.

Figure 4C:
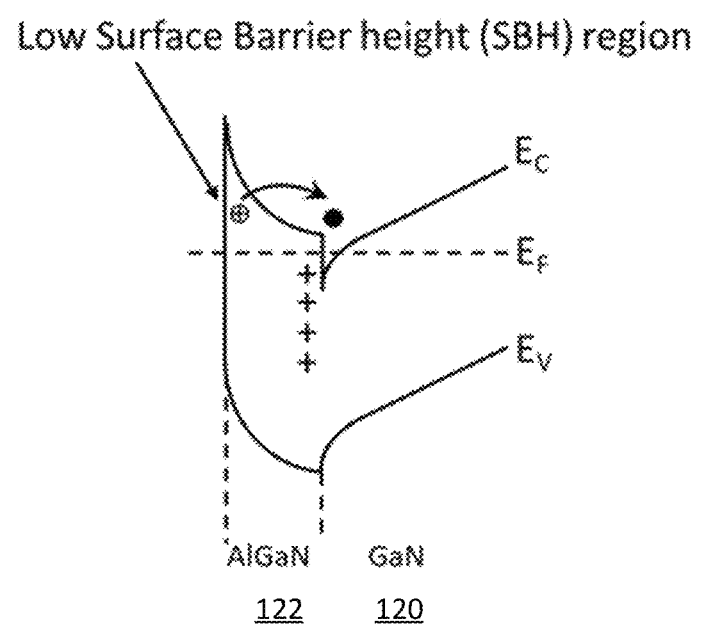
FIG. 4C is a band diagram that illustrates surface barrier height in a HEMT device.

FIG. 4C illustrates the surface barrier height of a HEMT device, which is the energy barrier between the Fermi level $E_F$ and the conduction band $E_C$ at the surface of the barrier layer 122. As can be seen in FIG. 4C, it is believed that lowering the surface barrier height of the device may allow carriers that would otherwise be trapped in the barrier layer 122 to move to the 2DEG region between the barrier layer 122 and the channel layer 120, where they can be conducted to the drain of the device.

Figure 5A:
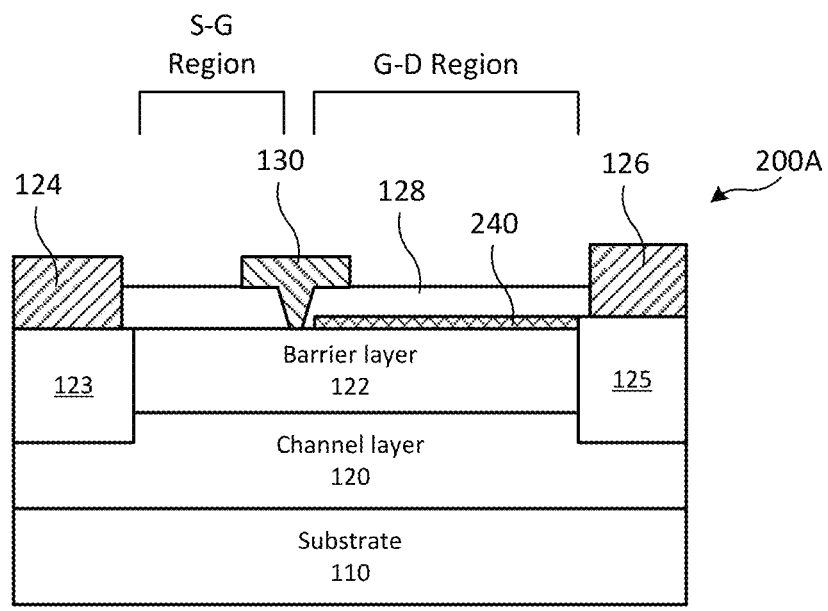
FIGS. 5A to 5D are cross-sectional views illustrating HEMT device structures in accordance with further embodiments.

To overcome this effect, some embodiments provide the modified access region 140 only in selective portions of the device active region between the source and drain regions 123, 125 of the devices. In particular, some embodiments may overcome one or more disadvantages by localizing the charge emission path provided by the modified access region 140 to a region that does not extend beneath the gate contact. Referring to FIG. 5A, a localized charge emission path is provided in a GaN HEMT device 200A by a modified access region 240 that is provided only in a region (labeled G-D region in FIG. 5A) between the gate contact 130 and the drain region 125. In particular embodiments, the modified access region 240 may not extend beneath the gate contact 130, so that the gate contact 130 directly contacts the barrier layer 122.

The modified access region 240 may have a reduced surface barrier height relative to a portion of the barrier layer 122 between the gate contact 130 and the source region 123. Selectively providing the modified access region 240 may improve the transient behavior of the device as well as the Schottky barrier height of the device. In some embodiments, the modified access region 240 may be formed by masking and selective epitaxial growth of the modified access region 140 similar to the embodiments shown in FIG. 3B.

Figure 3D:
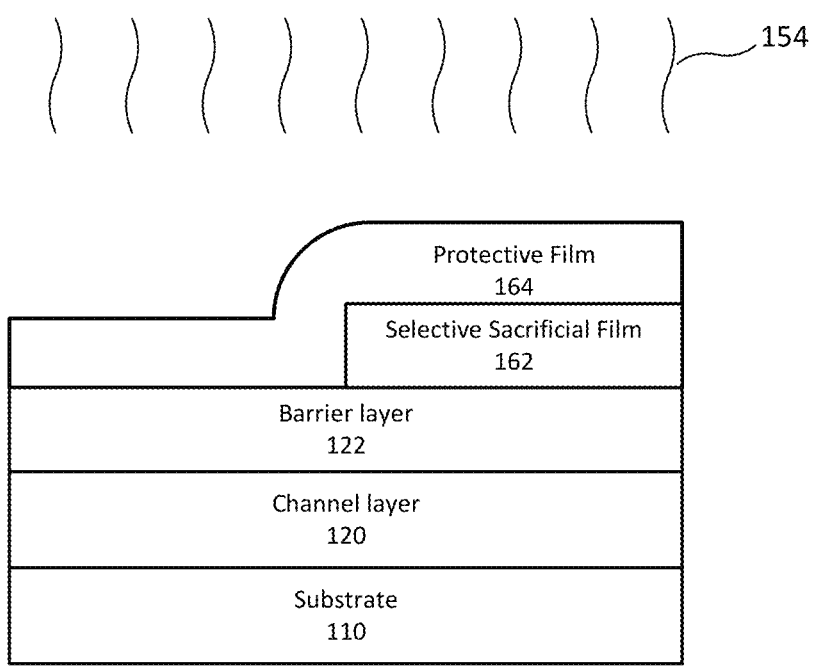
Figure 5B:
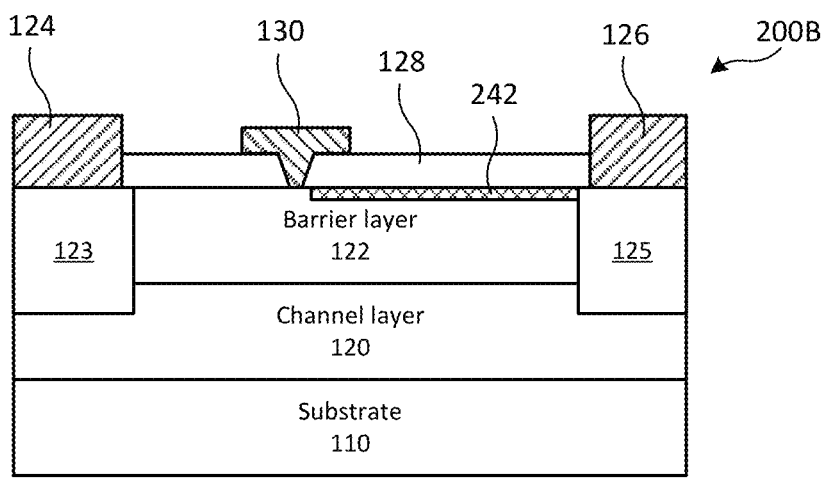

Referring to FIG. 5B, in some embodiments, a modified access region 242 may be provided in the barrier layer 122 between the gate contact 130 and the drain region 125 in a GaN HEMT device 200B. The modified access region 242 may be formed by selective formation of the selective sacrificial film 162 (as shown in FIG. 3D) prior to annealing, for example by masking and etching the sacrificial film 152 of FIG. 3A to form the selective sacrificial film 162 of FIG. 3D prior to annealing. A protective film 164 may be formed over the selective sacrificial film 162 prior to annealing. In further embodiments, referring to FIG. 3C, the modified access region 242 may be formed by masking and selective implantation of ions 156 into the barrier layer 122.

Figure 5C:
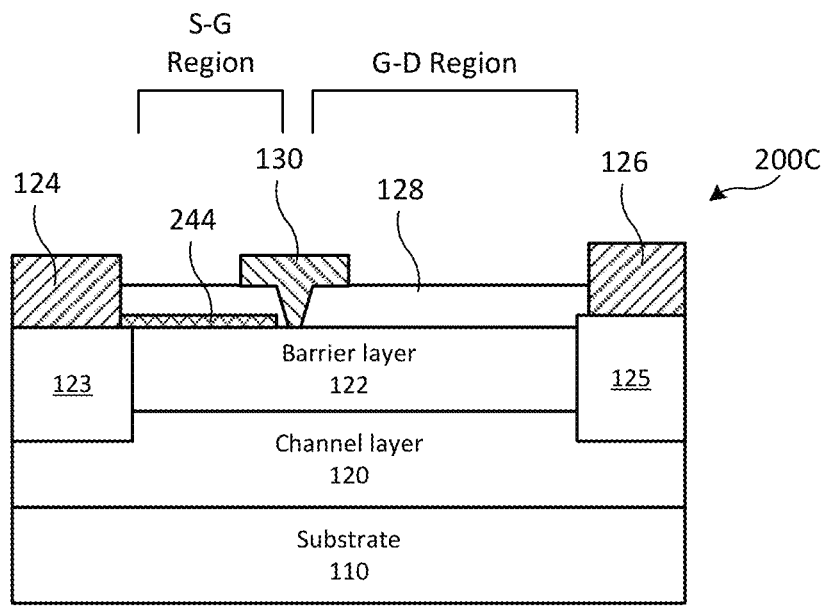

Referring to FIG. 5C, a GaN HEMT structure 200C according to further embodiments is illustrated. In the GaN HEMT structure 200C, a modified access region 244 having a reduced surface barrier height is provided only in the S-G region between the source region 123 and the gate contact 130 (but not beneath the gate contact 130). Accordingly, the device shown in FIG. 5C may have a reduced surface barrier height in a region between the source contact 124 and the gate contact 130 while maintaining a high Schottky barrier between the gate contact 130 and the barrier layer 122. Although not illustrated in FIG. 5C, it will be appreciated that the modified access region 244 may be formed as a surface region within the barrier layer 122 as described above with respect to FIG. 5B.

Figure 5D:
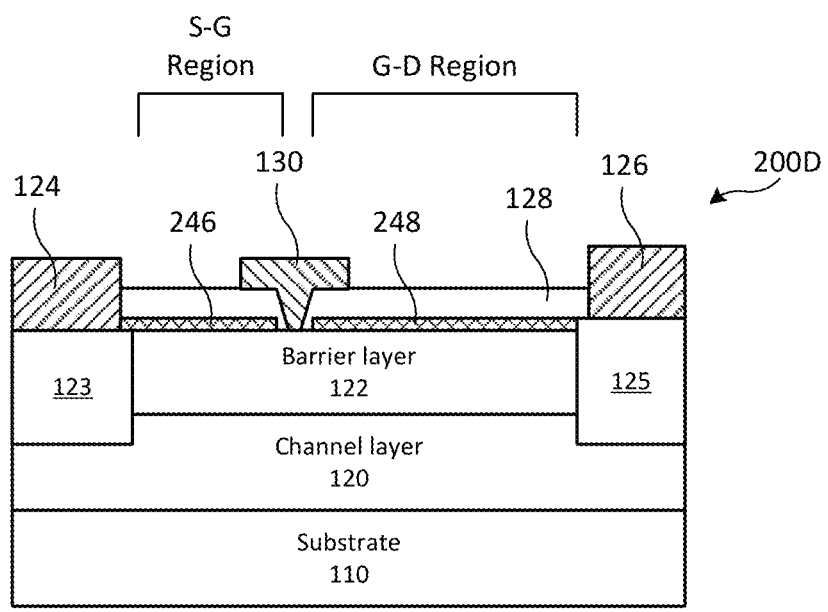

Referring to FIG. 5D, a GaN HEMT structure 200D according to further embodiments is illustrated. In the GaN HEMT structure 200C, a first modified access region 246 having a reduced surface barrier height is provided in the S-G region between the source region 123 and the gate contact 130 (but not beneath the gate contact 130), and a second modified access region 248 having a reduced surface barrier height is provided in the G-D region between the gate contact 130 and the drain region 125 (but not beneath the gate contact 130). Accordingly, the device shown in FIG. 5D may have a reduced surface barrier height in a region between the source contact 124 and the gate contact 130 and in a region between the gate contact 130 and the drain contact 126 while maintaining a high Schottky barrier between the gate contact 130 and the barrier layer 122. Although not illustrated in FIG. 5D, it will be appreciated that one or both of the first modified access region 246 and the second modified access region 248 may be formed as a surface region within the barrier layer 122 as described above with respect to FIG. 5B.

Figure 6A:
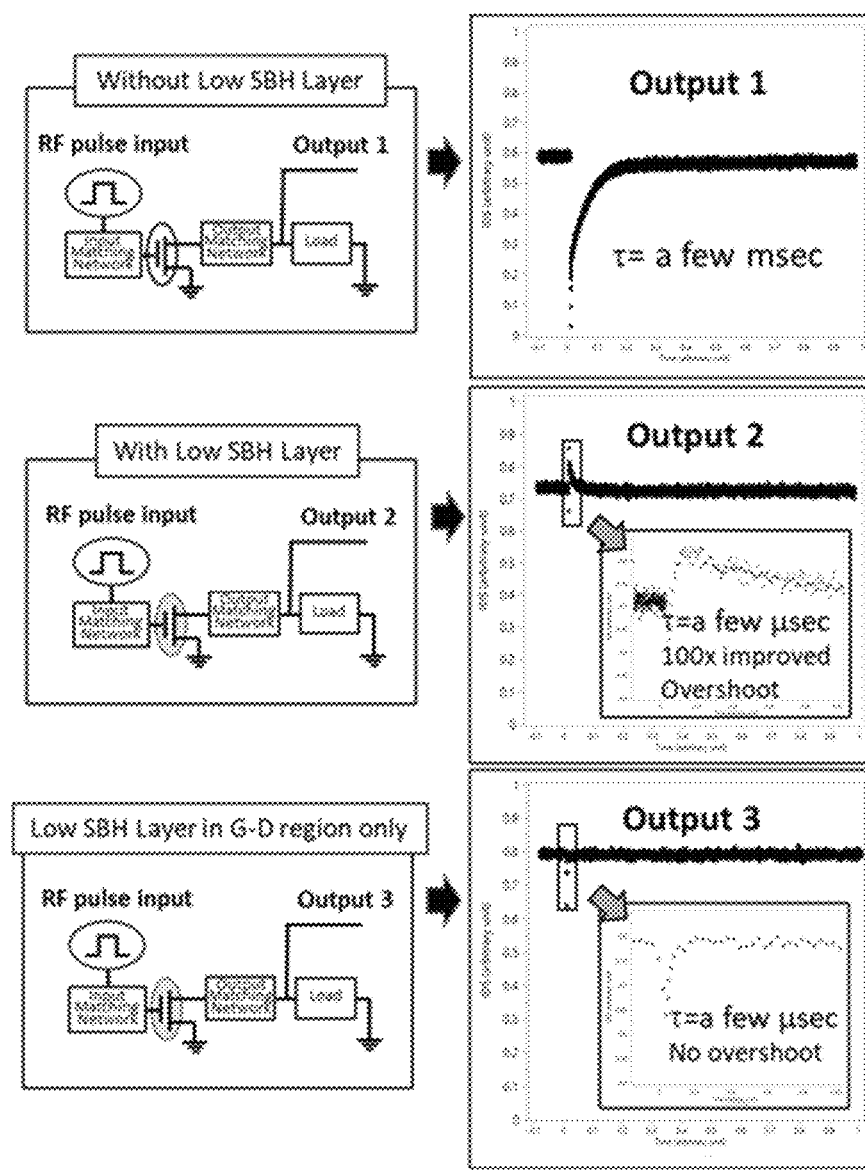
FIG. 6A illustrates results of a test setup including a conventional GaN HEMT and GaN HEMTs including modified access regions according to various embodiments.
Figure 6B:
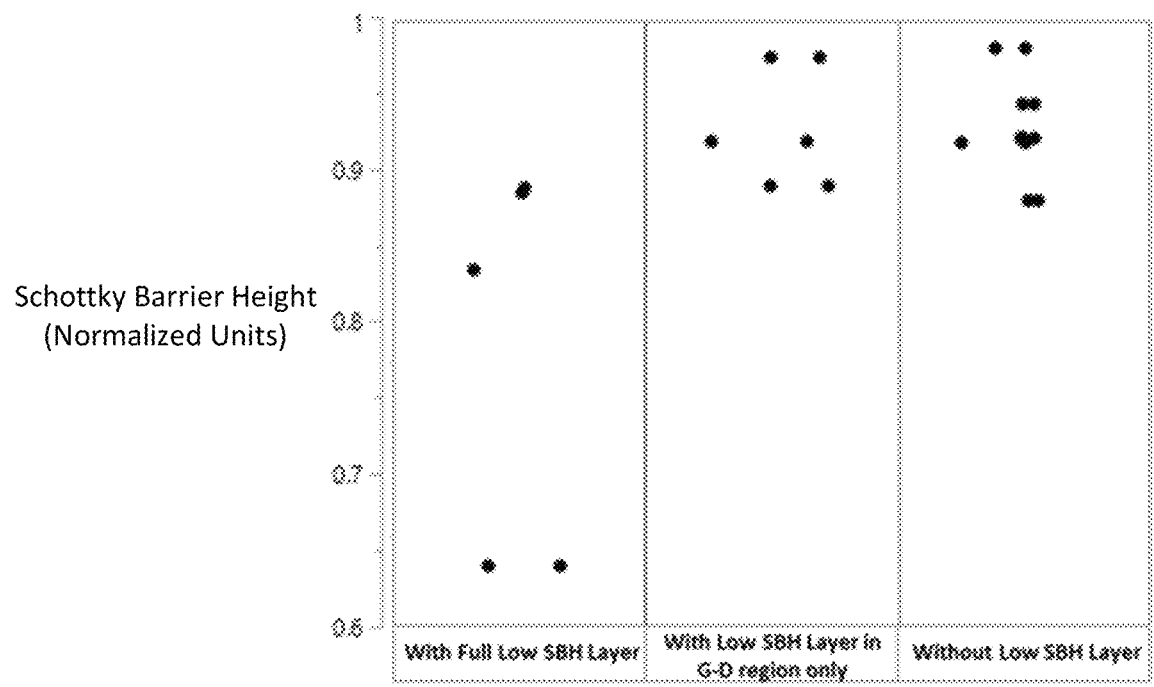
FIG. 6B is a chart that compares surface barrier heights of conventional transistors with surface barrier heights of transistors including modified access regions according to various embodiments.

The presence of a modified access region may increase switching speed in a transistor according to some embodiments without causing undesirable overshoot of the drain current. For example, FIG. 6A illustrates results of a test setup including a conventional GaN HEMT transistor, a GaN HEMT transistor including a modified access region 140 over the entire active region between the source and drain regions 123, 125, and a GaN HEMT transistor including a modified access region 240 having a reduced SBH only in the G-D region. FIG. 6B compares Schottky barrier heights of conventional transistors with Schottky barrier heights of transistors including modified access regions 140 and transistors including modified access regions 240 only in the G-D region as described herein.

Referring to FIG. 6A, devices without modified access regions (upper graph) and with full modified access regions 140 (middle graph) and partial modified access regions 240 (lower graph) were subjected to an RF pulse input. In particular the device transient behaviors were tested with a setup of input/output matching network circuits and a load under proper bias conditions and RF pulse input into the gate terminal of each device. The resulting output waveforms are shown on the right.

Devices with the partial modified access region 240 exhibited a recovery time constant ($\tau$) of about a few microseconds, which is comparable to the performance of devices with full modified access regions 140. However, as can be seen in FIG. 6A, the devices with the partial modified access region 240 exhibited no apparent overshoot of the output signal. Additionally, referring to FIG. 6B, devices with a partial modified access region 240 had similar surface barrier heights as devices without a modified access region.

Figure 7A:
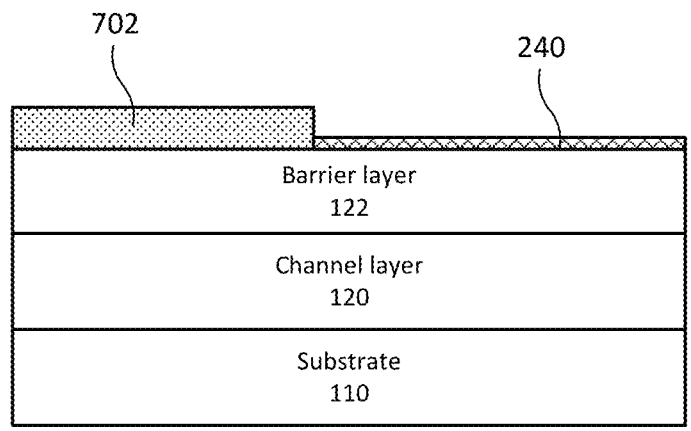
FIGS. 7A to 7C are cross-sectional views illustrating operations for forming HEMT device structures according to various embodiments.
Figure 7B:
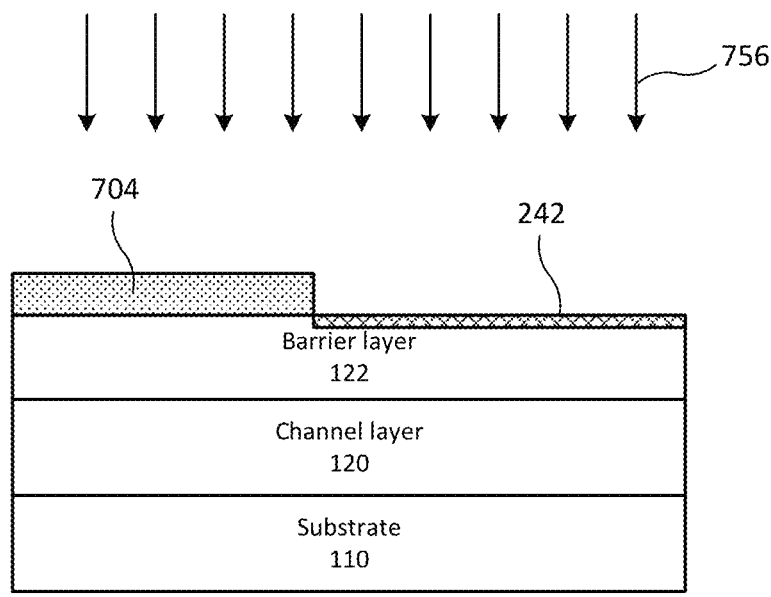
Figure 7C:
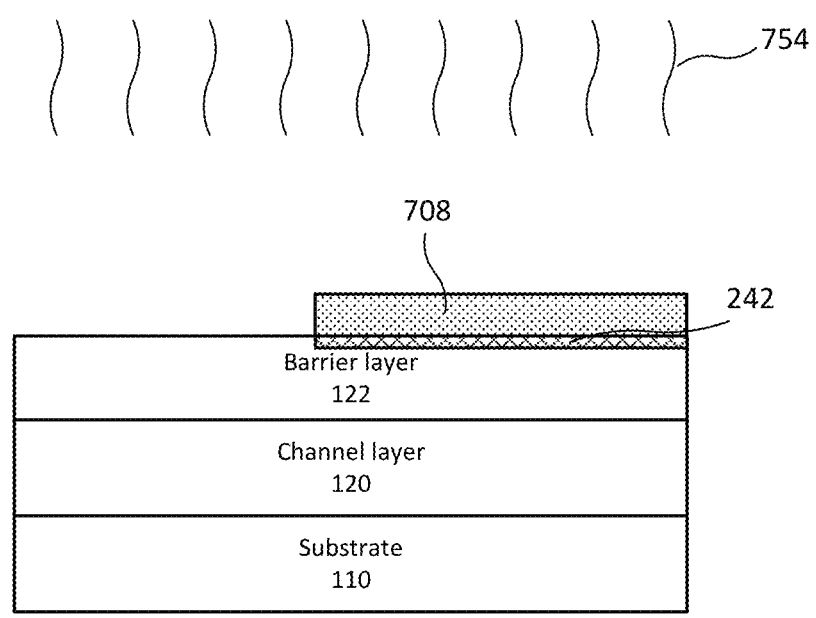

Selective formation of partial modified access regions 240, 242 is illustrated in FIGS. 7A to 7C. For example, referring to FIG. 7A, after formation of the channel layer 120 and the barrier layer 122 on the substrate 110, an epitaxial growth mask 702 may be selectively formed on an upper surface of the barrier layer 122 in a region corresponding to the S-G region of the device (FIG. 5A). The epitaxial growth mask 702 exposes a portion of the surface of the barrier layer corresponding to the G-D region of the device. An epitaxial layer is then selectively formed on the exposed portion of the barrier layer 122 to form the modified access region 240.

Referring to FIG. 7B, in some embodiments, an implant mask 704 is selectively formed on an upper surface of the barrier layer 122 in a region corresponding to the S-G region of the device. The implant mask 704 exposes a portion of the surface of the barrier layer corresponding to the G-D region of the device. Dopant ions 756 are then implanted into the exposed surface of the barrier layer 122 to form the modified access region 240.

Referring to FIG. 7C, in some embodiments, a sacrificial layer 708 is selectively formed on an upper surface of the barrier layer 122 in a region corresponding to the G-D region of the device. The implant mask 704 exposes a portion of the surface of the barrier layer corresponding to the S-G region of the device. The structure is then annealed 754 to form the modified access region 242. A surface protection layer (not shown) may be formed over the sacrificial layer before annealing to prevent surface desorption of the barrier layer during the anneal. The sacrificial layer is then removed, for example, via etching.

Figure 8:
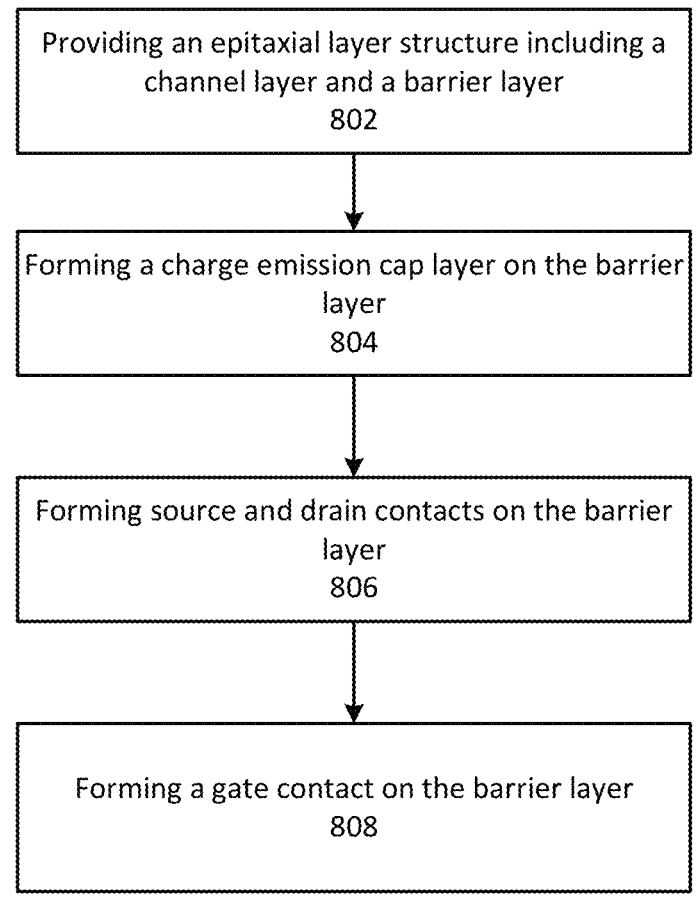
FIG. 8 is a block diagram illustrating operations of forming a transistor device according to some embodiments.

FIG. 8 illustrates a method of forming a transistor device. The method includes providing a semiconductor epitaxial layer structure including a channel layer and a barrier layer on the channel layer, wherein the barrier layer has a higher bandgap than the channel layer (block 802). A modified access region is formed at an upper surface of the barrier layer opposite the channel layer (block 804). A source contact and a drain contact are formed on the barrier layer (block 806), and a gate contact is formed between source contact and the drain contact. The modified access region comprises a material having a lower surface barrier height relative to the gate contact than the barrier layer.

Forming the modified access region may include forming a sacrificial dielectric layer on the barrier layer; annealing the sacrificial dielectric layer and the barrier layer; and removing the sacrificial dielectric layer. The sacrificial dielectric layer may include SiN, SiOx, AlN, AlO, and/or HfO.

Forming the modified access region may include forming an epitaxial layer on the barrier layer of a material having a lower bandgap than the barrier layer. The epitaxial layer may be doped with n-type dopants.

In some embodiments, forming the modified access region includes implanting n-type dopants into an upper surface of the barrier layer opposite the channel layer.

In some embodiments, the modified access region is in a region between the gate contact and the drain contact and does not extend completely between the source contact and the drain contact. In some embodiments, the gate contact forms a non-ohmic contact to the barrier layer and does not contact the modified access region.

The method may further include forming a doped drain region in the barrier layer wherein the drain contact contacts the drain region, wherein the modified access region contacts the drain region.

Transistor devices including modified access regions as described herein may be used in amplifiers that operate in a wide variety of different frequency bands. In some embodiments, the RF transistor amplifiers incorporating transistor devices as described herein may be configured to operate at frequencies greater than 1 GHz. In other embodiments, the RF transistor amplifiers may be configured to operate at frequencies greater than 2.5 GHz. In still other embodiments, the RF transistor amplifiers may be configured to operate at frequencies greater than 3.1 GHz. In yet additional embodiments, the RF transistor amplifiers may be configured to operate at frequencies greater than 5 GHz. In some embodiments, the RF transistor amplifiers may be configured to operate in at least one of the 2.5-2.7 GHz, 3.4-4.2 GHz, 5.1-5.8 GHz, 12-18 GHz, 18-27 GHz, 27-40 GHz or 40-75 GHz frequency bands or sub-portions thereof.

Although embodiments of the inventive concepts have been discussed above with respect to HEMT devices, it will be understood that the inventive concepts described herein may be applied to other types of semiconductor devices, such as MOSFETs, DMOS transistors, and/or laterally diffused MOS (LDMOS) transistors.

RF transistor amplifiers incorporating transistor devices described herein can be used in standalone RF transistor amplifiers and/or in multiple RF transistor amplifiers. Examples of how the RF transistor amplifiers according to some embodiments may be used in applications that include multiple amplifiers will be discussed with reference to FIGS. 9A-9C.

Figure 9A:
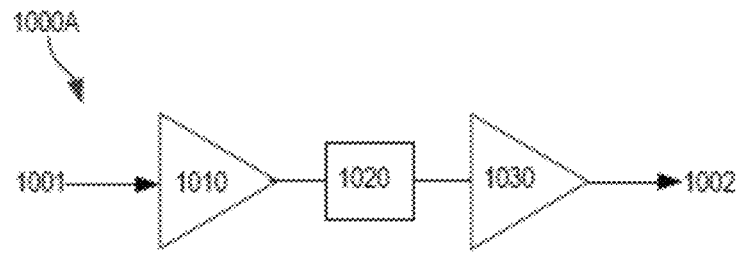
FIGS. 9A-9C are schematic block diagrams of multi-amplifier circuits in which RF transistor amplifiers incorporating transistor devices according to embodiments may be used.

Referring to FIG. 9A, an RF transistor amplifier 1000A is schematically illustrated that includes a pre-amplifier 1010 and a main amplifier 1030 that are electrically connected in series. As shown in FIG. 9A, RF transistor amplifier 1000A includes an RF input 1001, the pre-amplifier 1010, an inter-stage impedance matching network 1020, the main amplifier 1030, and an RF output 1002. The inter-stage impedance matching network 1020 may include, for example, inductors and/or capacitors arranged in any appropriate configuration in order to form a circuit that improves the impedance match between the output of pre-amplifier 1010 and the input of main amplifier 1030. While not shown in FIG. 9A, RF transistor amplifier 1000A may further include an input matching network that is interposed between RF input 1001 and pre-amplifier 1010, and/or an output matching network that is interposed between the main amplifier 1030 and the RF output 1002. The RF transistor amplifiers according to embodiments may be used to implement either or both of the pre-amplifier 1010 and the main amplifier 1030.

Figure 9B:
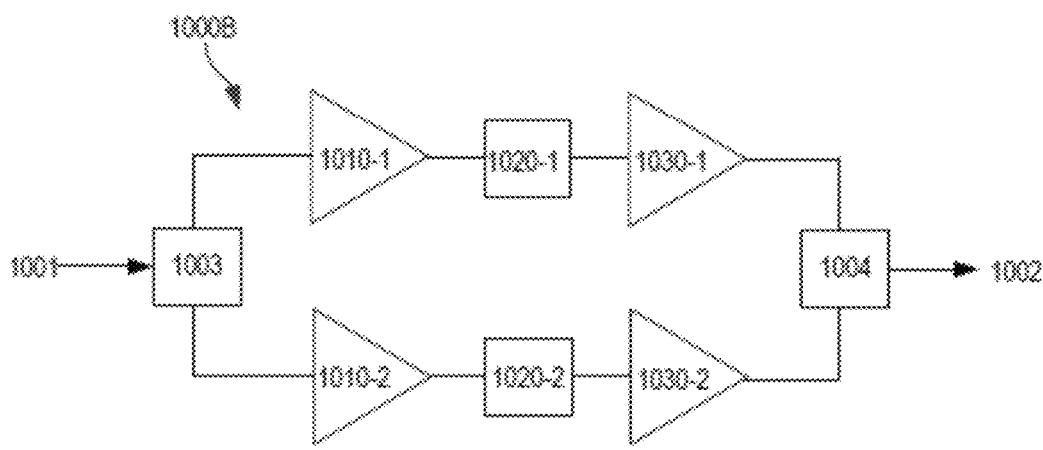

Referring to FIG. 9B, an RF transistor amplifier 1000B is schematically illustrated that includes an RF input 1001, a pair of pre-amplifiers 1010-1, 1010-2, a pair of inter-stage impedance matching networks 1020-1, 1020-2, a pair of main amplifiers 1030-1, 1030-2, and an RF output 1002. A splitter 1003 and a combiner 1004 are also provided. Pre-amplifier 1010-1 and main amplifier 1030-1 (which are electrically connected in series) are arranged electrically in parallel with pre-amplifier 1010-2 and main amplifier 1030-2 (which are electrically connected in series). As with the RF transistor amplifier 1000A of FIG. 9A, RF transistor amplifier 1000B may further include an input matching network that is interposed between RF input 1001 and pre-amplifiers 1010-1, 1010-2, and/or an output matching network that is interposed between the main amplifiers 1030-1, 1030-2 and the RF output 1002.

Figure 9C:
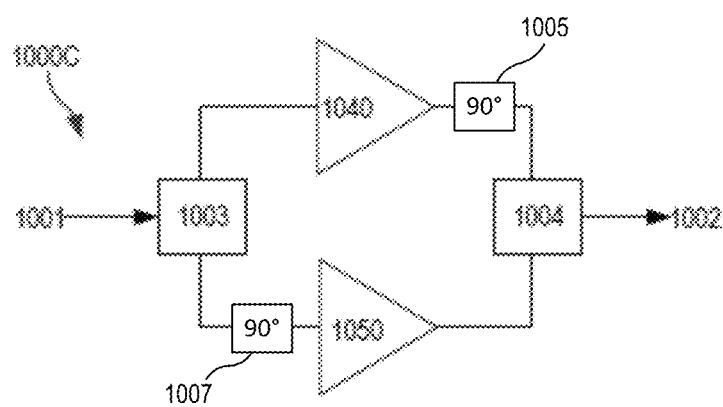

As shown in FIG. 9C, the RF transistor amplifiers according to some embodiments may also be used to implement Doherty amplifiers. As is known in the art, a Doherty amplifier circuit includes first and second (or more) power-combined amplifiers. The first amplifier is referred to as the "main" or "carrier" amplifier and the second amplifier is referred to as the "peaking" amplifier. The two amplifiers may be biased differently. For example, the main amplifier may comprise a Class AB or a Class B amplifier while the peaking amplifier may be a Class C amplifier in one common Doherty amplifier implementation. The Doherty amplifier may operate more efficiently than balanced amplifiers when operating at power levels that are backed off from saturation. An RF signal input to a Doherty amplifier is split (e.g., using a quadrature coupler), and the outputs of the two amplifiers are combined. The main amplifier is configured to turn on first (i.e., at lower input power levels) and hence only the main amplifier will operate at lower power levels. As the input power level is increased towards saturation, the peaking amplifier turns on and the input RF signal is split between the main and peaking amplifiers.

As shown in FIG. 9C, the Doherty RF transistor amplifier 1000C includes an RF input 1001, an input splitter 1003, a main amplifier 1040, a peaking amplifier 1050, an output combiner 1004 and an RF output 1002. The Doherty RF transistor amplifier 1000C includes a 90° transformer 1007 at the input of the peaking amplifier 1050 and a 90° transformer 1005 at the input of the main amplifier 1040, and may optionally include input matching networks and/or an output matching networks (not shown). The main amplifier 1040 and/or the peaking amplifier 1050 may be implemented using any of the above-described RF transistor amplifiers according to embodiments.

The RF transistor amplifiers according to embodiments may be formed as discrete devices, or may be formed as part of a Monolithic Microwave Integrated Circuit (MMIC). A MMIC refers to an integrated circuit that operates on radio and/or microwave frequency signals in which all of the circuitry for a particular function is integrated into a single semiconductor chip. An example MMIC device is a transistor amplifier that includes associated matching circuits, feed networks and the like that are all implemented on a common substrate. MMIC transistor amplifiers typically include a plurality of unit cell HEMT transistors that are connected in parallel.

Figure 10:
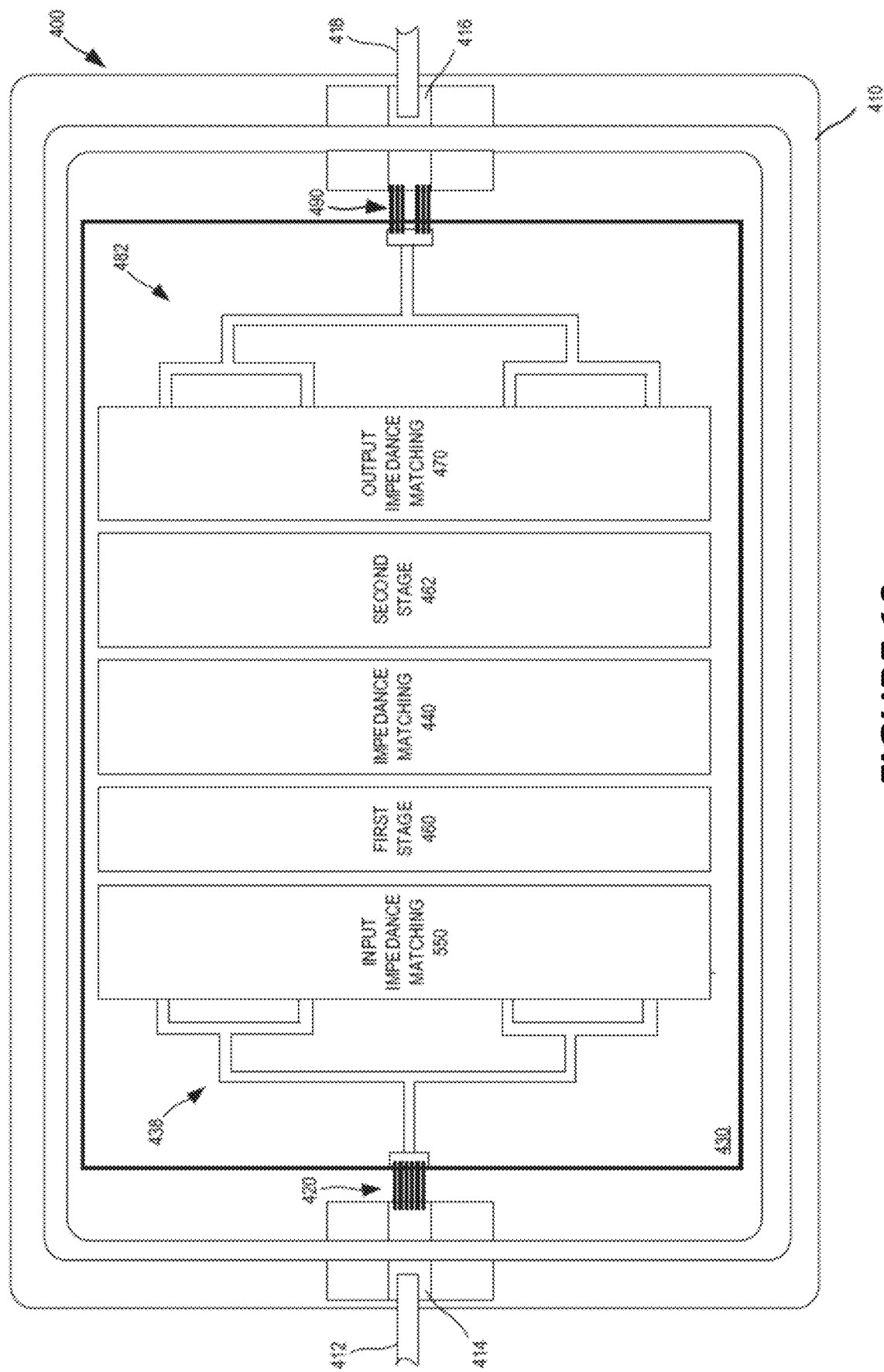
FIG. 10 is a schematic illustration of a MMIC amplifier including a HEMT transistor according to some embodiments.

FIG. 10 is a plan view of a MMIC RF transistor amplifier 400 according to embodiments of the present inventive concepts. As shown in FIG. 10, the MMIC RF transistor amplifier 400 includes an integrated circuit chip 430 that is contained within a package 410. The package 410 may comprise a protective housing that surrounds and protects the integrated circuit chip 430. The package 410 may be formed of, for example, a ceramic material.

The package 410 includes an input lead 412 and an output lead 418. The input lead 412 may be mounted to an input lead pad 414 by, for example, soldering. One or more input bond wires 420 may electrically connect the input lead pad 414 to an input bond pad on the integrated circuit chip 430. The integrated circuit chip 430 includes an input feed network 438, an input impedance matching network 450, a first RF transistor amplifier stage 460, an intermediate impedance matching network 440, a second RF transistor amplifier stage 462, an output impedance matching stage 470, and an output feed network 482.

The package 410 further includes an output lead 418 that is connected to an output lead pad 416 by, for example, soldering. One or more output bond wires 490 may electrically connect the output lead pad 416 to an output bond pad on the integrated circuit chip 430. The first RF transistor amplifier stage 460 and/or the second RF transistor amplifier stage 462 may be implemented using any of the RF transistor amplifiers according to embodiments of the present inventive concepts.

The RF transistor amplifiers according to embodiments of the present inventive concepts may be designed to operate in a wide variety of different frequency bands. In some embodiments, these RF transistor amplifier dies may be configured to operate in at least one of the 0.6-2.7 GHz, 3.4-4.2 GHz, 5.1-5.8 GHz, 12-18 GHz, 18-27 GHz, 27-40 GHz or 40-75 GHz frequency bands or sub-portions thereof. The techniques according to embodiments of the present inventive concepts may be particularly advantageous for RF transistor amplifiers that operate at frequencies of 10 GHz and higher.

Figure 11A:
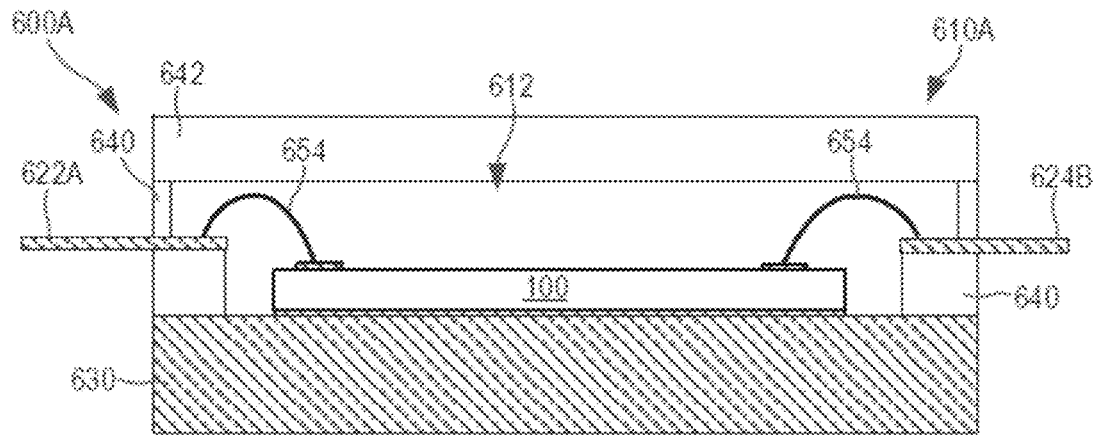
FIGS. 11A and 11B are schematic cross-sectional views illustrating example packages for RF transistor amplifier dies according to some embodiments.
Figure 11B:
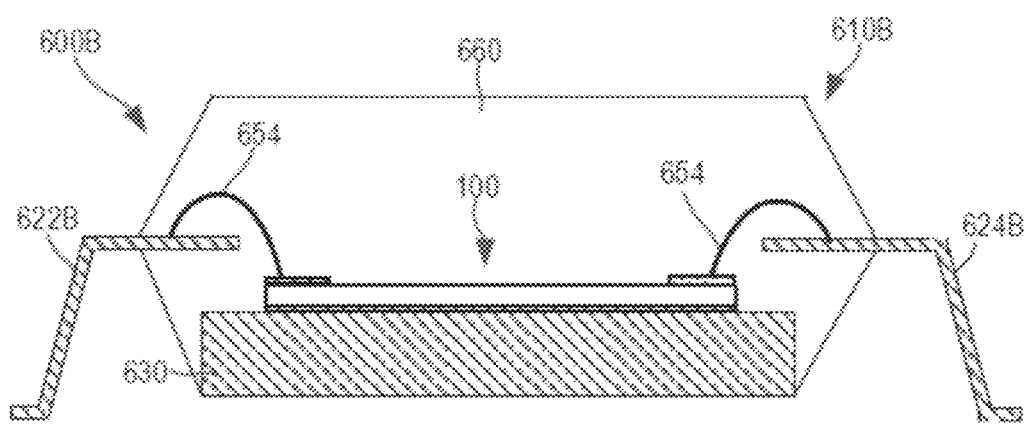

FIGS. 11A and 11B are schematic cross-sectional views illustrating several example ways that that the RF transistor amplifier dies according to embodiments of the present inventive concepts may be packaged to provide packaged RF transistor amplifiers 600A and 600B, respectively.

FIG. 11A is a schematic side view of a packaged Group III nitride-based RF transistor amplifier 600A. As shown in FIG. 11A, packaged RF transistor amplifier 600A includes the RF transistor amplifier die 100 packaged in an open cavity package 610A. The package 610A includes metal gate leads 622A, metal drain leads 624A, a metal submount 630, sidewalls 640 and a lid 642.

The submount 630 may include materials configured to assist with the thermal management of the package 600A. For example, the submount 630 may include copper and/or molybdenum. In some embodiments, the submount 630 may be composed of multiple layers and/or contain vias/interconnects. In an example embodiment, the submount 630 may be a multilayer copper/molybdenum/copper metal flange that comprises a core molybdenum layer with copper cladding layers on either major surface thereof. In some embodiments, the submount 630 may include a metal heat sink that is part of a lead frame or metal slug. The sidewalls 640 and/or lid 642 may be formed of or include an insulating material in some embodiments. For example, the sidewalls 640 and/or lid 642 may be formed of or include ceramic materials.

In some embodiments, the sidewalls 640 and/or lid 642 may be formed of, for example, $Al_2O_3$. The lid 642 may be glued to the sidewalls 640 using an epoxy glue. The sidewalls 640 may be attached to the submount 630 via, for example, braising. The gate lead 622A and the drain lead 624A may be configured to extend through the sidewalls 640, though embodiments of the present inventive concepts are not limited thereto.

The RF transistor amplifier die 100 is mounted on the upper surface of the metal submount 630 in an air-filled cavity 612 defined by the metal submount 630, the ceramic sidewalls 640 and the ceramic lid 642. The gate and drain terminals of RF transistor amplifier die 100 may be on the top side of the structure, while the source terminal is on the bottom side of the structure.

The gate lead 622A may be connected to the gate terminal of RF transistor amplifier die 100 by one or more bond wires 654. Similarly, the drain lead 624A may be connected to the drain terminal of RF transistor amplifier die 100 by one or more bond wires 654. The source terminal may be mounted on the metal submount 630 using, for example, a conductive die attach material (not shown). The metal submount 630 may provide the electrical connection to the source terminal 126 and may also serve as a heat dissipation structure that dissipates heat that is generated in the RF transistor amplifier die 100.

The heat is primarily generated in the upper portion of the RF transistor amplifier die 100 where relatively high current densities are generated in, for example, the channel regions of the unit cell transistors. This heat may be transferred though the source vias 146 and the semiconductor layer structure of the device to the source terminal and then to the metal submount 630.

FIG. 11B is a schematic side view of another packaged Group III nitride based RF transistor amplifier 600B. RF transistor amplifier 600B differs from RF transistor amplifier 600A in that it includes a different package 610B. The package 610B includes a metal submount 630, as well as metal gate and drain leads 622B, 624B. RF transistor amplifier 600B also includes a plastic overmold 660 that at least partially surrounds the RF transistor amplifier die 100, the leads 622B, 624B, and the metal submount 630.

Many variations of the features of the above embodiments are possible. Transistor structures with features that may be used in embodiments of the present invention are disclosed in the following commonly assigned publications, the contents of each of which are fully incorporated by reference herein in their entirety: U.S. Pat. No. 6,849,882 to Chavarkar et al. and entitled "Group-III Nitride Based High Electron Mobility Transistor (HEMT) With Barrier/Spacer Layer"; U.S. Pat. No. 7,230,284 to Parikh et al. and entitled "Insulating Gate AlGaN/GaN HEMT"; U.S. Pat. No. 7,501,669 to Parikh et al. and entitled "Wide Bandgap Transistor Devices With Field Plates"; U.S. Pat. No. 7,126,426 to Mishra et al. and entitled "Cascode Amplifier Structures Including Wide Bandgap Field Effect Transistor With Field Plates"; U.S. Pat. No. 7,550,783 to Wu et al. and entitled "Wide Bandgap HEMTs With Source Connected Field Plates"; U.S. Pat. No. 7,573,078 to Wu et al. and entitled "Wide Bandgap Transistors With Multiple Field Plates"; U.S. Pat. Pub. No. 2005/0253167 to Wu et al. and entitled "Wide Bandgap Field Effect Transistors With Source Connected Field Plates"; U.S. Pat. Pub. No. 2006/0202272 to Wu et al. and entitled "Wide Bandgap Transistors With Gate-Source Field Plates"; U.S. Pat. Pub. No. 2008/0128752 to Wu and entitled "GaN Based HEMTs With Buried Field Plates"; U.S. Pat. Pub. No. 2010/0276698 to Moore et al. and entitled "Gate Electrodes For Millimeter-Wave Operation and Methods of Fabrication; U.S. Pat. Pub. No. 2012/0049973 to Smith, Jr. et al. and entitled "High Power Gallium Nitride Field Effect Transistor Switches"; U.S. Pat. Pub. No. 2012/0194276 to Fisher and entitled "Low Noise Amplifiers Including Group III Nitride Based High Electron Mobility Transistors"; and U.S. Pat. No. 9,847,411 to Sriram et al. entitled "Recessed field plate transistor structures."

Although embodiments of the inventive concepts have been described in considerable detail with reference to certain configurations thereof, other versions are possible. The field plates and gates can also have many different shapes and can be connected to the source contact in many different ways. Accordingly, the spirit and scope of the invention should not be limited to the specific embodiments described above.

What is claimed is:

1. A transistor device, comprising:
   a semiconductor epitaxial layer structure including a channel layer and a barrier layer on the channel layer, wherein the barrier layer has a higher bandgap than the channel layer;
   a modified access region at an upper surface of the barrier layer opposite the channel layer;
   a source contact and a drain contact on the barrier layer; and
   a gate contact between source contact and the drain contact, wherein the modified access region comprises a material having a lower surface barrier height than the barrier layer; and
   wherein the modified access region is between the gate contact and the drain contact and does not extend between the source contact and the gate contact.

2. The transistor device of claim 1, wherein the gate contact forms a Schottky contact to the modified access region.

3. The transistor device of claim 1, further comprising:
   a doped source region in the barrier layer, wherein the source contact contacts the source region; and
   a doped drain region in the barrier layer, wherein the drain contact contacts the drain region, the source region and drain region defining an active region of the device between the source region and the drain region;
   wherein the modified access region is on the barrier layer within active region of the device.

4. The transistor device of claim 1, wherein the modified access region comprises a region of increased conductivity relative to a conductivity of the barrier layer at an upper surface of the barrier layer opposite the channel layer.

5. The transistor device of claim 4, wherein the modified access region comprises an implanted region comprising implanted dopants at the upper surface of the barrier layer opposite the channel layer.

6. The transistor device of claim 4, wherein the modified access region has a thickness of about 0.1 nm to about 40 nm and a doping concentration of about $1E14$ $cm^{-3}$ to about $1E17$ $cm^{-3}$.

7. The transistor device of claim 6, wherein the modified access region has a thickness of about 0.5 nm to about 10 nm.

8. The transistor device of claim 1, wherein the modified access region comprises an epitaxial semiconductor layer of a material having a lower bandgap than the barrier layer.

9. The transistor device of claim 8, wherein the barrier layer comprises AlGaN and the modified access region comprises AlGaN with a lower concentration of Al than the barrier layer.

10. The transistor device of claim 8, wherein the barrier layer comprises AlGaN and the modified access region comprises GaN.

11. The transistor device of claim 8, wherein the modified access region is doped with n-type dopants.

12. The transistor device of claim 8, wherein the modified access region has a thickness of about 0.1 nm to about 40 nm and a doping concentration of about $1E14$ $cm^{-3}$ to about $1E17$ $cm^{-3}$.

13. The transistor device of claim 12, wherein the modified access region has a thickness of about 0.5 nm to about 10 nm.

14. The transistor device of claim 1, wherein the modified access region provides a charge emission path that allows charge carriers present at an upper surface of the barrier layer opposite the channel layer to conduct toward the drain contact.

15. The transistor device of claim 1, wherein the gate contact contacts the barrier layer and does not contact the modified access region.

16. The transistor device of claim 1, further comprising a doped drain region in the barrier layer wherein the drain contact contacts the drain region, wherein the modified access region contacts the drain region.

17. A method of forming a transistor device, comprising:
providing a semiconductor epitaxial layer structure including a channel layer and a barrier layer on the channel layer, wherein the barrier layer has a higher bandgap than the channel layer;
forming a modified access region at an upper surface of the barrier layer opposite the channel layer;
forming a source contact and a drain contact on the barrier layer; and
forming a gate contact between source contact and the drain contact, wherein the modified access region comprises a material having a lower surface barrier height than the barrier layer;
wherein forming the modified access region comprises:
forming a sacrificial dielectric layer on the barrier layer;
annealing the sacrificial dielectric layer and the barrier layer; and
removing the sacrificial dielectric layer.

18. The method of claim 17, wherein the sacrificial dielectric layer comprises SiN, SiOx, AN, AlO, and/or HfO.

19. The method of claim 18, wherein the epitaxial layer is doped with n-type dopants.

20. The method of claim 17,
wherein forming the modified access region comprises:
implanting n-type dopants into an upper surface of the barrier layer opposite the channel layer.

21. The method of claim 17, wherein the modified access region is in a region between the gate contact and the drain contact and does not extend completely between the source contact and the drain contact.

22. The method of claim 21, wherein the gate contact forms a non-ohmic contact to the barrier layer and does not contact the modified access region.

23. The method of claim 21, further comprising forming a doped drain region in the barrier layer wherein the drain contact contacts the drain region, wherein the modified access region contacts the drain region.

24. A transistor device, comprising:
a semiconductor epitaxial layer structure including a channel layer and a barrier layer on the channel layer, wherein the barrier layer has a higher bandgap than the channel layer;
a modified access region at an upper surface of the barrier layer opposite the channel layer, wherein the modified access region comprises a region of increased conductivity relative to a conductivity of the barrier layer at an upper surface of the barrier layer opposite the channel layer, and wherein the modified access region comprises an implanted region comprising implanted dopants at the upper surface of the barrier layer opposite the channel layer;
a source contact and a drain contact on the barrier layer; and
a gate contact between source contact and the drain contact.

25. The transistor device of claim 24, wherein the modified access layer is on the barrier layer and extends between the source contact and the drain contact.

26. The transistor device of claim 24, wherein the modified access layer is formed only between the gate contact and the drain contact and not between the gate contact and the source contact.

27. The transistor device of claim 24, wherein the modified access layer is formed between the source contact and the gate contact.

28. The transistor device of claim 24, wherein the modified access layer is formed between the gate contact and the drain contact and between the source contact and the gate contact and is not formed beneath the gate contact.

* * * * *